(12) United States Patent
Chiu

(10) Patent No.: US 9,097,918 B2
(45) Date of Patent: Aug. 4, 2015

(54) MASK FOR CURING FRAME SEALANT AND LIQUID CRYSTAL DISPLAY PANEL MANUFACTURING METHOD

(75) Inventor: Chung Yi Chiu, Guangdong (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 253 days.

(21) Appl. No.: 13/636,156

(22) PCT Filed: Jul. 4, 2012

(86) PCT No.: PCT/CN2012/078152
§ 371 (c)(1),
(2), (4) Date: Sep. 20, 2012

(87) PCT Pub. No.: WO2014/000316
PCT Pub. Date: Jan. 3, 2014

(65) Prior Publication Data
US 2013/0344767 A1  Dec. 26, 2013

(30) Foreign Application Priority Data

Jun. 25, 2012 (CN) .......................... 2012 1 0209773

(51) Int. Cl.
G02F 1/13 (2006.01)
G02F 1/1337 (2006.01)
G02F 1/1333 (2006.01)
G03F 1/50 (2012.01)

(52) U.S. Cl.
CPC ........ *G02F 1/1303* (2013.01); *G02F 1/133788* (2013.01); *G02F 1/133351* (2013.01); *G02F 2001/133742* (2013.01); *G03F 1/50* (2013.01)

(58) Field of Classification Search
None
See application file for complete search history.

(56) References Cited

FOREIGN PATENT DOCUMENTS

| CN | 101061431 A | 10/2007 |
|---|---|---|
| JP | H11133442 A | 5/1999 |
| JP | 2002131760 A | 5/2002 |
| JP | 2012118219 A | 6/2012 |

OTHER PUBLICATIONS

Machine translation of JP H11 133442 A published May 21, 1999.*

* cited by examiner

*Primary Examiner* — Britt D Hanley
(74) *Attorney, Agent, or Firm* — Kirton McConkie; Evan R. Witt

(57) ABSTRACT

A mask for curing frame sealant and a liquid crystal display (LCD) panel manufacturing method are provided in the present invention. A gradient shading region is formed in a joining area between a shading region and a transparent region, such that the gradient shading region is integrally formed. When the mask is utilized for exposure, the irradiation transmittance in the gradient shading region is smaller than the irradiation transmittance in the transparent region, but the irradiation transmittance in the gradient shading region is higher than the irradiation transmittance in the shading region. The pre-polymerization reaction of the irradiated monomers occurrence can be avoided in the present invention, and the pre-tilt angles in the liquid crystal layer are kept to be all the same during the alignment process.

15 Claims, 4 Drawing Sheets

MASK FOR CURING FRAME SEALANT AND LIQUID CRYSTAL DISPLAY PANEL MANUFACTURING METHOD

FIELD OF THE INVENTION

The present invention relates to a liquid crystal display (LCD) technology, and more particularly to a mask for curing frame sealant and an LCD manufacturing method.

BACKGROUND OF THE INVENTION

In a manufacturing process of a liquid crystal display (LCD) panel, a finished fabrication of a thin film transistor (TFT) substrate is required to bond with a color filter (CF) substrate.

Please refer to FIG. 1, which is a structural view illustrating a TFT substrate 10'. The TFT substrate 10' includes display regions 11' and non-display regions 12'. The frame sealant 13' is coated onto circumference areas of the display regions 11' and surrounds the display regions 11'.

Please refer to FIG. 2, which is a schematic view illustrating a conventional LCD panel manufacture utilizing a mask for an irradiation process. After the TFT substrate 10' and the CF substrate 20' are joined, an ultraviolet (UV) ray is used to irradiate the frame sealant 13' so that the frame sealant 13' is cured to bond the TFT substrate 10' and the CF substrate 20' together. During the UV ray irradiation, the regions which are not intended to receive radiation are protected by the mask 30'.

In FIG. 2, the mask 30' includes a transparent substrate 31', a plurality of shading regions 32' and a plurality of transparent regions 33'. The shading regions 32' are formed on the transparent substrate 31' by a shading material, and the regions which are not shielded by the shading material form the transparent regions 33'. The transparent regions 33' correspond to the non-display regions 12' of the TFT substrate 10', and the shading regions 32' correspond to the display regions 11' of the TFT substrate 10'. The UV ray can only irradiate the regions in corresponding non-display regions 12' of the LCD panel, and since the frame sealant 13' is coated onto the non-display regions 12', the frame sealant 13' is cured by the UV ray such that the TFT substrate 10' is bonded with the CF substrate 20', as well as sealing the liquid crystal (LC) molecules within the liquid crystal (LC) layer 40'.

However, in practical operation processes, the edge portions of the shading regions 32' are not adequately blocking the UV ray because of actual operation and the diffraction property of the UV ray. Therefore, a portion of the UV ray is transmitted to the display regions 11' of the LCD panel. As shown in the figure, the display regions 11' correspond to the LC layer 40', and the LC layer 40' includes LC molecules. M' in FIG. 2 represents the irradiation intensity of the UV ray which is transmitted to the LC layer 40'. In a Polymer Stabilized Vertical Alignment (PSVA) type LCD manufacture process, a pre-polymerization reaction of the monomers occurs when the monomers within the LC layer 40' are irradiated by the UV ray since the LC molecules of the LC layer 40' are blended with the monomers. In a subsequent alignment process of the LC layer 40', the property of the monomers, which is pre-polymerized, is different from the property of other monomers. Different pre-tilt angles are generated within the LC layer 40' when the same voltage is inputted and the photo-alignment process is applied. Especially, the pre-tilt angles which are generated by the pre-irradiated monomers around the edges of the LC layer 40' are more disordered than the pre-tilt angles which are generated by the other monomers, and the display quality of the PSVA type LCD is affected.

Therefore, the technical problem described above which exists in current technology needs to be resolved.

SUMMARY OF THE INVENTION

An object of the present invention is to provide a mask for curing frame sealant to resolve the technical problem that an irradiation for the frame sealant curing process causes the polymerization reaction of the monomers around the edges of the LC layer, and disordered pre-tilt angles which are generated in post alignment process of the LC layer affect the display result of the LCD.

For achieving the above-mentioned resolution, the present invention proposes a mask utilized for curing frame sealant. The mask comprises a transparent substrate and a shading region formed on the transparent substrate and a transparent region adjacent to the shading region; wherein a gradient shading region is formed in a joining area between the shading region and the transparent region.

The gradient shading region is integrally formed and connects with the shading region. When the mask is utilized for exposure, the irradiation transmittance in the gradient shading region is smaller than the irradiation transmittance in the transparent region, but the irradiation transmittance in the gradient shading region is higher than the irradiation transmittance in the shading region. When a distance is increased between the gradient shading region and the shading region, the density of the gradient shading region is gradually decreased and the irradiation transmittance in the gradient shading region is linearly changed.

In one embodiment of the present invention, the shading region is formed by a first shading material, the gradient shading region is also formed by the first shading material, and the density of the first shading material in the gradient shading region is smaller than the density of the first shading material in the shading region.

In one embodiment of the present invention, the shading region is formed by a first shading material, the gradient shading region is formed by a second shading material, and the irradiation transmittance of the second shading material is higher than the irradiation transmittance of the first shading material.

In one embodiment of the present invention, the first shading material is chromium (Cr), and the second shading material is a compound of silicon (Si) and molybdenum (Mo), or a compound of chromium (Cr).

Another object of the present invention is to provide a mask utilized for curing frame sealant and resolves the technical problem that the pre-tilt angles which are generated in a subsequent liquid crystal layer alignment are disordered, and the display result of the LCD is affected due to the monomers around the edges of the LC layer being irradiated thereby polymerization reaction occurs during the frame sealant curing process.

For achieving the above-mentioned resolution, the present invention proposes a mask used for curing frame sealant. The mask comprises a transparent substrate and a shading region formed on the transparent substrate, and a transparent region adjacent to the shading region; wherein a gradient shading region is formed in a joining area between the shading region and the transparent region.

The gradient shading region is formed integrally and connects to the shading region; when the mask is utilized for exposure, the irradiation transmittance in the gradient shading region is smaller than the irradiation transmittance in the transparent region, but the irradiation transmittance in the gradient shading region is higher than the irradiation transmittance in the shading region.

In one embodiment of the present invention, the shading region is formed by a first shading material, the gradient shading region is also formed by the first shading material, and the density of the first shading material in the gradient shading region is smaller than the density of the first shading material in the shading region.

In one embodiment of the present invention, the shading region is formed by a first shading material, the gradient shading region is formed by a second shading material, and the irradiation transmittance of the second shading material is higher than the irradiation transmittance of the first shading material.

In one embodiment of the present invention, when a distance is increased between the gradient shading region and the shading region, the density of the gradient shading region is gradually decreased and the irradiation transmittance in the gradient shading region is linearly changed.

In one embodiment of the present invention, wherein the first shading material is chromium (Cr), and the second shading material is a compound of silicon (Si) and molybdenum (Mo), or a compound of chromium (Cr).

Another object of the present invention is to provide a liquid crystal display (LCD) panel manufacturing method to resolve the technical problem that the pre-tilt angles which are generated in a subsequent liquid crystal layer alignment are disordered, and the display result of the LCD is affected due to the monomers in the edge of the liquid layer being irradiated thereby the polymerization reaction occurs during the frame sealant curing process.

For achieving the above-mentioned resolution, the present invention proposes a liquid crystal display (LCD) panel manufacturing method, and the method includes the following steps:

providing a first substrate, a second substrate, and a mask; wherein the first substrate is coated a frame sealant which surrounds display regions; the mask includes a shading region, a transparent region adjacent to the shading region, and a gradient shading region formed in a joining area between the shading region and the transparent region; the gradient shading region is formed integrally and connects to the shading region of the mask;

joining the first substrate and the second substrate together and disposing the mask on the first substrate, also aligning the gradient shading region to the frame sealant; and exposing the first substrate and the second substrate after the joining step so the frame sealant is cured to bond the first substrate and the second substrate together; wherein the irradiation transmittance in the gradient shading region is smaller than the irradiation transmittance in the transparent region, but the irradiation transmittance in the gradient shading regions is higher than the irradiation transmittance in the shading region.

In one embodiment of the present invention, during the exposing step, the gradient shading region can lead/guide a light to transmit to the frame sealant and not transmit to the LC molecules in corresponding display region, and the frame sealant is completely cured by controlling the exposure time.

In one embodiment of the present invention, the shading region is formed by a first shading material, the gradient shading region is also formed by the first shading material, and the density of the first shading material in the gradient shading region is smaller than the density of the first shading material in the shading region.

In one embodiment of the present invention, the shading region is formed by a first shading material, the gradient shading region is formed by a second shading material, and the irradiation transmittance of the second shading material is higher than the irradiation transmittance of the first shading material.

In one embodiment of the present invention, when a distance is increased between the gradient shading region and the shading region, the density of the gradient shading region is gradually decreased and the irradiation transmittance in the gradient shading region is linearly changed.

In one embodiment of the present invention, the first shading material is chromium (Cr), and the second shading material is a compound of silicon (Si) and molybdenum (Mo), or a compound of chromium (Cr).

The above-mention description of the present invention can be best understood by referring to the following detailed description of the preferred embodiments and the accompanying drawings.

DETAILED DESCRIPTION OF THE PREFERRED EMBODIMENTS

In the following detailed description of the preferred embodiments, reference is made to the accompanying drawings which form a part hereof, and as shown by way of illustration specific embodiments in which the invention may be practiced. In this regard, directional terminology, such as "top," "bottom," "front," "back," "left," "right," "inside," "outside," "side," etc., is used with reference to the orientation of the Figure(s) being described. As such, the directional terminology is used for purposes of illustration and is in no way limiting the present invention.

Figure 1:
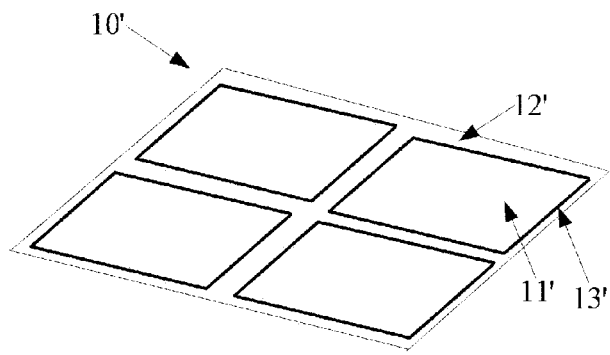
FIG. 1 is a structural schematic view illustrating a TFT substrate in a conventional technology.
Figure 2:
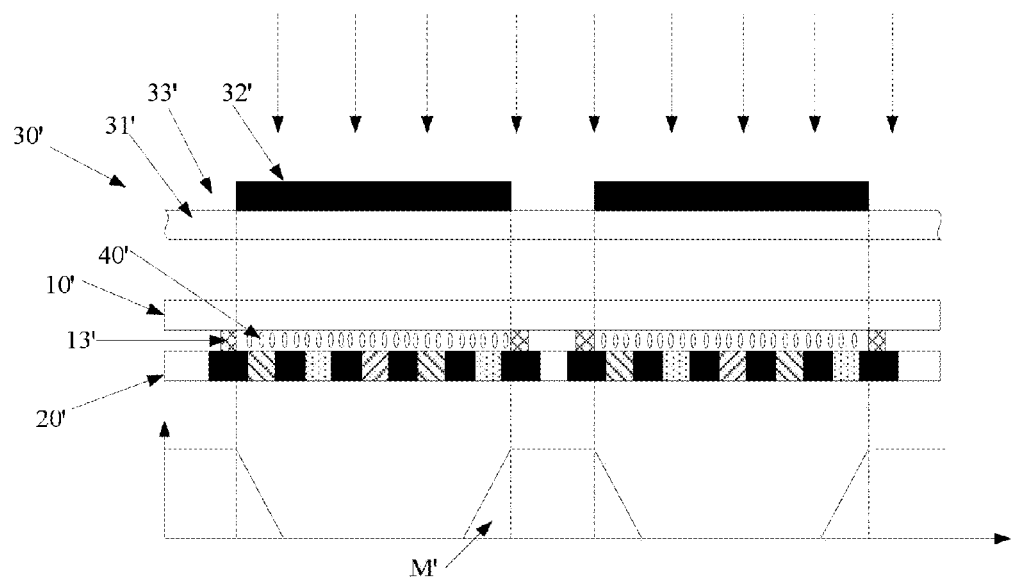
FIG. 2 is a schematic view illustrating a mask used in the irradiation process of the conventional LCD panel manufacture.
Figure 3:
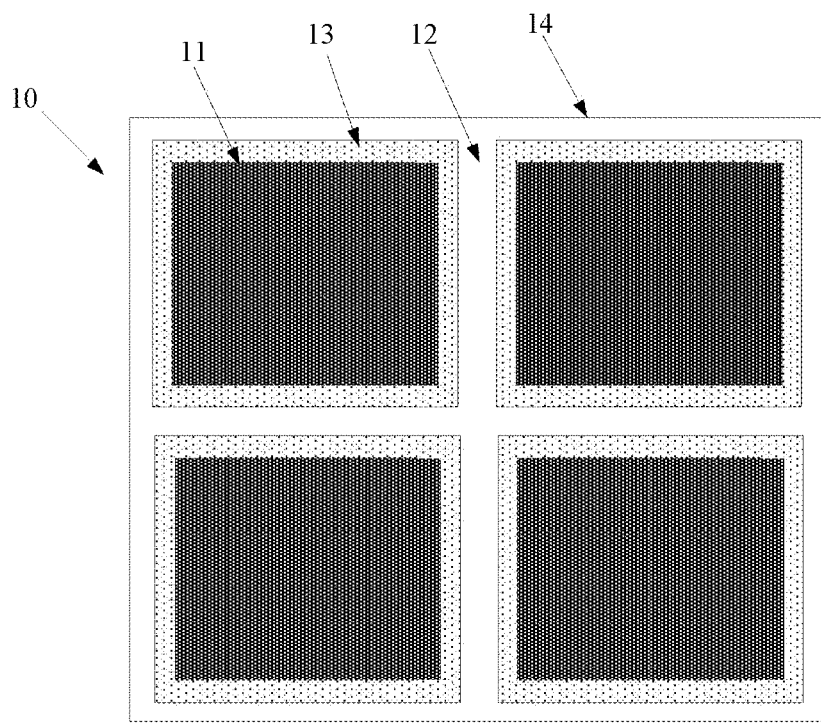
FIG. 3 is a structural schematic view illustrating a mask for curing frame sealant in a first preferred embodiment of the present invention.

FIG. 3 is a structural view illustrating a mask 10 for curing frame sealant in a first preferred embodiment of the present invention.

The mask 10 comprises a transparent substrate 14 and a plurality of shading regions 11 formed on the transparent substrate 14 and defines a plurality of transparent regions 12. The mask 10 of the present invention further includes a plurality of gradient shading regions 13, and each of the gradient shading regions 13 is disposed in a joining area between the shading region 11 and the transparent region 12, as well as connects with the shading region 11. The gradient shading region 13 is integrally formed.

When the mask 10 is utilized for exposure, the irradiation transmittance in the gradient shading region 13 is lower than the irradiation transmittance in the transparent region 12 by a first predetermined rate but higher than the irradiation transmittance in the shading region 11 by a second predetermined rate. The ranges of the first predetermined rate and the second predetermined rate are preferably 40% to 60%. For example, if the irradiation transmittance in the shading region is 50%, only half of light can be passed through. Generally, the irradiation transmittance in the transparent region 12 is 100% or close to 100%, and the irradiation transmittance in the shading region 11 is 0 or close to 0.

In the present embodiment, the gradient shading region 13 is formed as an extension of the shading region 11. Specifically, the shading region 11 and the gradient shading region 13 are formed to comprise the same first shading material. The difference between the shading region 11 and the gradient shading region 13 is that the density of the first shading material in the gradient shading region 13 is smaller than the density of the first shading material in the shading region 11. For example, the density of the first shading material in the gradient shading region 13 is half of the density of the first shading material in the shading region 11. That is, the quantity of the molecules in the gradient shading region 13 per unit volume (such as 1 $cm^3$) is half of the quantity of the molecules in the shading region 11 so that there are ample voids existing in the gradient shading region 13. A portion of light can be passed through the voids. If the irradiation transmittance of the ultraviolet (UV) ray in the shading region 11 is 0, and the irradiation transmittance of the UV ray in the transparent region 12 is 100%, then the irradiation transmittance of the UV ray in the gradient shading region 13 can be 50%.

In practical process, the gradient shading region 13 is formed by the first shading material and a transparent solvent. By controlling the dose of the first shading material in the gradient shading region 13, an effect that the irradiation transmittance in the gradient shading region 13 is varied can be achieved. For example, during the forming procedure of the gradient shading region 13, the transparent solvent is increased in a high temperature and the dose of the shading material is decreased in the gradient shading region 13 at the same time. Therefore, the first shading material is evenly dispersed in the transparent solvent to form the gradient shading region 13 so that ample voids exist in the gradient shading region 13 to increase the irradiation transmittance.

In another preferred embodiment, the shading regions 11 are formed by the first shading material, but the gradient shading regions 13 are formed by a second shading material. The shading result in the second shading material is lower than the first shading material. In other words, the irradiation transmittance of the UV ray in the second shading material is higher than the irradiation transmittance of the UV ray in the first shading material, and the irradiation transmittance in the gradient shading region 13 is a predetermined rate lower than the irradiation transmittance in the transparent region 12. For example, the first shading material used in the shading regions 11 is chromium (Cr), and the second shading material used in the gradient shading regions 13 is a compound of silicon (Si) and molybdenum (Mo), or a compound of chromium (Cr). Alternatively, the density of the first shading material and the density of the second shading material can be also adjusted in addition to selecting the proper materials so as to control the irradiation transmittances. Therefore, the irradiation transmittance in the gradient shading regions 13 is lower than the irradiation transmittance in the transparent regions 12 by a first predetermined rate, such as 50%.

Figure 4:
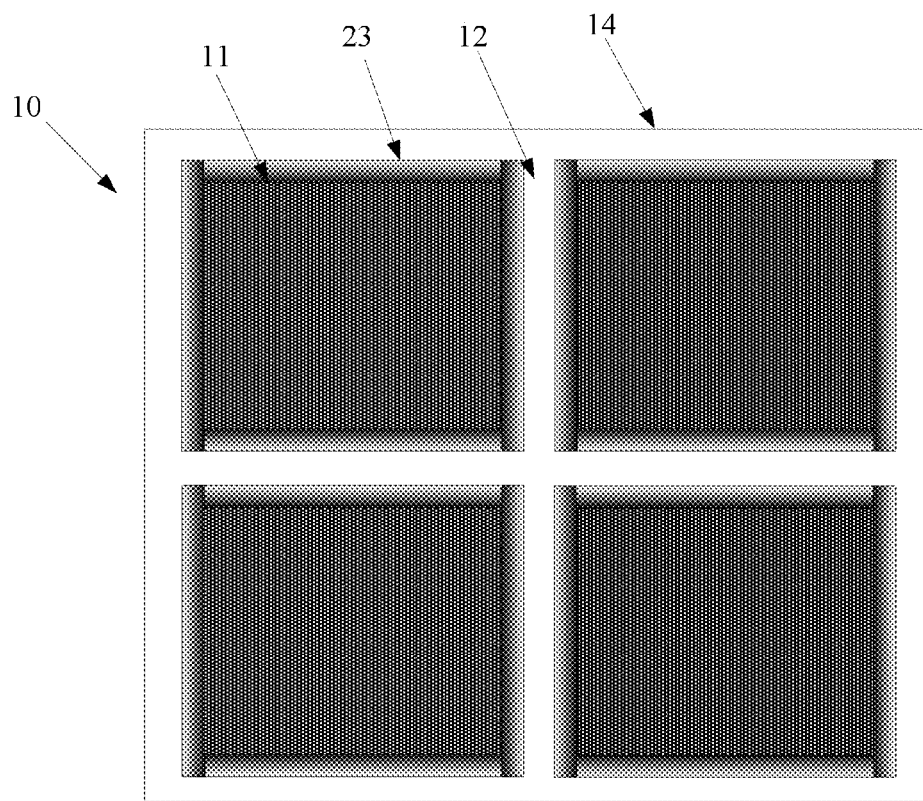
FIG. 4 is a structural schematic view illustrating the mask for curing frame sealant in another preferred embodiment of the present invention.

Please refer to FIG. 4, which is a structural schematic view illustrating the mask 10 for curing frame sealant in another preferred embodiment of the present invention.

The mask 10 in FIG. 4 includes a plurality of gradient shading regions 23, and the gradient shading regions 23 are formed by the first shading material or the second shading material. The difference between FIG. 3 and FIG. 4 is that the density of the first shading material or the density of the second shading material of the gradient shading region 13 in FIG. 4 is gradually decreased when a distance is gradually increased between the shading region 11 and the area of the gradient shading regions 13. In other words, the density of the first shading material or the density of the second shading material in the area of the gradient shading region 13 close to the shading region is larger and the density of the first shading material or the density of the second shading material in the area of the gradient shading region 23 away from the shading regions is smaller and close to 0. According to the above arrangement, the irradiation transmittance in the gradient shading regions 23 is linearly changed. That is, the closer an area of the gradient shading regions 23 to the shading region 11, the larger the irradiation transmittance thereof is, and the farther the area of the gradient shading region 23 away from the shading region, the smaller the irradiation transmittance thereof is.

Figure 5:
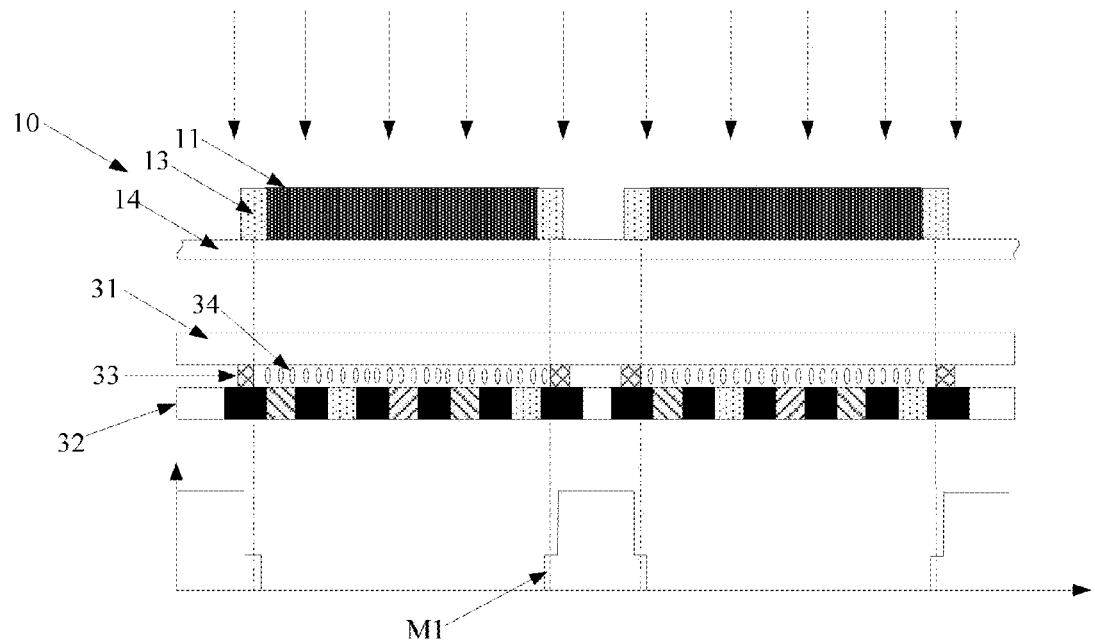
FIG. 5 is a schematic view illustrating the mask for curing frame sealant in FIG. 3 is used for exposure in a liquid crystal display (LCD) panel manufacturing process.

Please refer to FIG. 3 and FIG. 5, FIG. 5 is a schematic view illustrating that the mask for curing frame sealant in FIG. 3 is irradiated in a liquid crystal display (LCD) panel manufacturing process.

The LCD panel includes a first substrate 31 (such as a Thin-Film Transistor substrate) and a second substrate 32 (such as a CF substrate), and a frame sealant 33 is coated on the first substrate 31. The frame sealant 33 is disposed in a joining area (not marked in the drawing) between the non-display region and the display region in the first substrate 31 and circles around the display region.

When the first substrate 31 and the second substrate 32 are bonded together, the liquid crystals are injected into the display regions which are surrounded by the frame sealant 33. Subsequently, the frame sealant 33 is cured. Specifically, the shading regions 11 of the mask 10 in FIG. 3 correspond to the display regions of the first substrate 31, and the transparent regions 12 of the mask 10 in FIG. 3 correspond to the non-display regions of the first substrate 31. At this time, the gradient shading regions 23 of the mask 10 are aligned to the frame sealant 33 of the first substrate 31.

Subsequently, the first substrate 31 which was injected with the liquid crystals is exposed by a light, such as a UV ray. The gradient shading regions 13 of the mask 10 correspond to the frame sealant 33, when the light irradiates the gradient shading regions 13, only a portion of the light is passed through thereby significantly decreasing the irradiation quantity generated by diffraction of light into the display regions, as shown by M1 in FIG. 4 which indicates the irradiation intensity. As an obvious comparison to prior art, the quantity of the UV ray transmitted to the liquid crystal layer 34 is much lower by using the mask in the present invention and the affected region in the liquid crystal layer 34 is much smaller. Almost no UV ray irradiates the monomers, such that the pre-polymerization reaction of the monomers can be avoided.

The light not only enters the gradient shading regions 23 directly but is also diffracted from the transparent regions 12 to the frame sealant 33. By controlling the proper exposure time, the frame sealant 33 is able to be completely cured to bond the first substrate 31 and the second substrate 32 together and protect the monomers corresponding to the display region from the light irradiating so as to avoid the pre-polymerization reaction of the monomers. In a subsequent alignment process of the liquid crystal layer 34, the pre-tilt angles within the liquid crystal layer 34 are kept to be consistent so as to guarantee the display result of the LCD.

Figure 6:
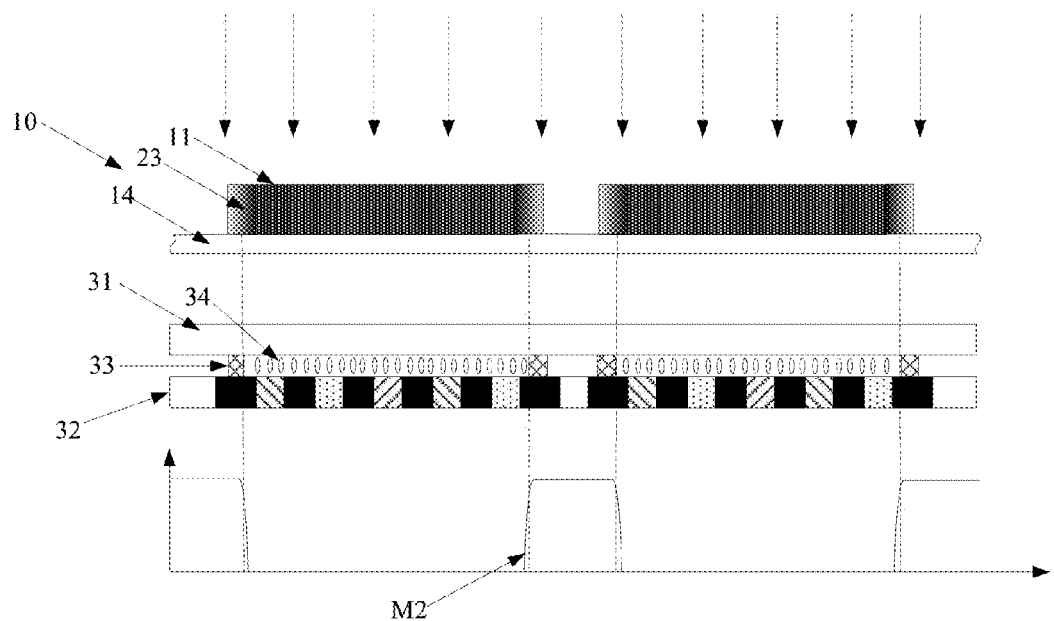
FIG. 6 is a schematic view illustrating the mask for curing frame sealant in FIG. 4 is used for exposure in the LCD panel manufacturing process.

Please refer to FIG. 6, which is a schematic view illustrating the mask utilized for curing the frame sealant in FIG. 4 in irradiation procedure during the LCD panel manufacturing process.

The first substrate 31 and the second substrate 32 are joined together, and the liquid crystal is injected into the display regions which are surrounded by the frame sealant 33 to form the liquid crystal layer 34. Subsequently, the frame sealant 33 is in a curing process. Specifically, the shading region 11 of the mask 10 in FIG. 4 is configured to be corresponding to the display region of the first substrate 31 and the transparent regions 12 of the mask 10 in FIG. 4 is configured to be corresponding to the non-display region of the first substrate 31. Therefore, the gradient shading region 23 of the mask 10 is aligned to the frame sealant 33 of the first substrate 31.

Now, the first substrate 31 which was injected with the liquid crystals is exposed by a light, such as a UV ray. Because the gradient shading region 23 of the mask 10 corresponds to the frame sealant 33, only a portion of the light is passed through and the irradiation quantity generated by the diffraction of light in the display regions is significantly decreased when the light irradiates in the gradient shading regions 23, as shown by M2 in FIG. 4 which indicates the irradiation intensity. As an obvious comparison to prior art, the transmittance quantity of the UV ray transmitted to the liquid crystal layer 34 is much lower by using the mask in the present invention and the affected region in the liquid crystal layer 34 is much smaller. Almost no UV ray irradiates the monomers, such that the pre-polymerization reaction of the monomers can be avoided.

The light not only directly irradiates through the gradient shading region 23 but also diffracted from the transparent regions 12 to the frame sealant 33. By controlling the proper exposure time, the frame sealant 33 is completely cured to bond the first substrate 31 and the second substrate 32 together and protect the monomers corresponding to the display region from the light irradiating so as to avoid the pre-polymerization reaction of the monomers. In a subsequent alignment process of the liquid crystal layer 34, the pre-tilt angles within the liquid crystal layer 34 are kept to be all the same so as to guarantee the display result of the LCD.

Figure 7:
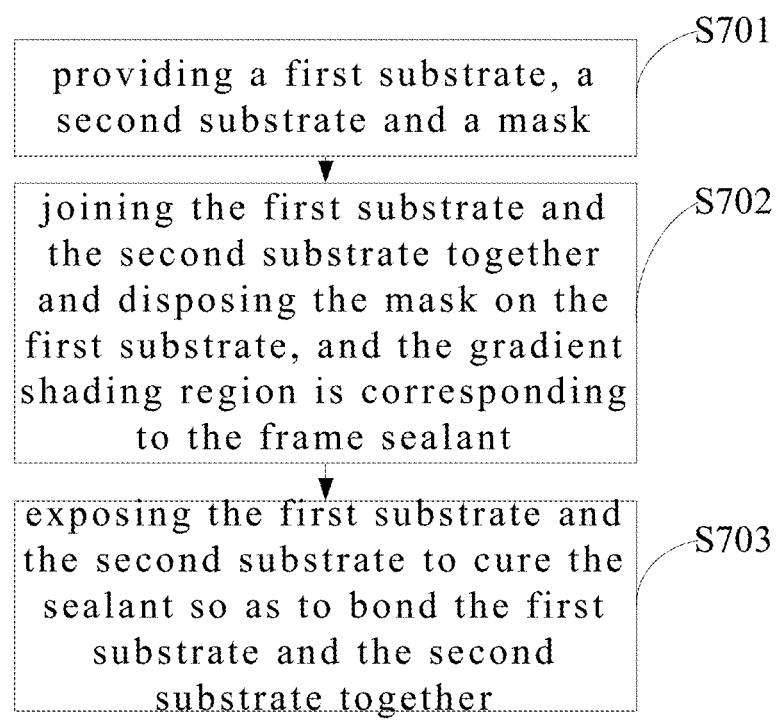
FIG. 7 is a flowchart illustrating the LCD panel manufacturing method in the preferred embodiment of the present invention.

FIG. 7 is a flowchart illustrating the LCD panel manufacturing method in a preferred embodiment of the present invention.

In step S701, a first substrate 31, a second substrate 32, and a mask 10 are provided. Please also refer to FIG. 4 in conjunction, the structure and the functions of the mask 10 have been described in the previous chapter and the detail description thereof is omitted herein.

The frame sealant 33 is coated on the first substrate 31. The mask 10 includes a plurality of shading regions 11 and a plurality of transparent regions 12. The shading regions 11 correspond to the display regions of the LCD panel and the transparent region 12 corresponds to the non-display region of the LCD panel. Gradient shading region 13 is disposed in a joining area between the shading region 11 and the transparent region 12. The gradient shading region 13 connects with the shading region 11, and the gradient shading region 13 corresponds to the frame sealant 33. In the present invention, the gradient shading region 13 is integrally formed.

In step S702, the first substrate 31 and the second substrate 32 are joined together and the first substrate 31 is disposed on the mask 10. The gradient shading region 13 corresponds to the frame sealant 33.

In step S703, the first substrate 31 and the second substrate 32 are exposed to the UV ray for curing the frame sealant 33, so that the first substrate 31 and the second substrate 32 are bonded together.

During the exposure process, the irradiation transmittance of the gradient shading regions 13 is lower than the irradiation transmittance of the transparent regions 12 by a predetermined rate and the ranges of the predetermined rate are about 40% to 60%. For example, if the irradiation transmittance in the gradient shading region 13 is 50%, only half of the light can be passed through the gradient shading region 13.

The light not only directly irradiates through the gradient shading region 13 but is also diffracted from the transparent region 12 to the frame sealant 33. By controlling the proper exposure time, the frame sealant 33 is completely cured to bond the first substrate 31 and the second substrate 32 together and protect the monomers corresponding to the display region from the light irradiating so as to avoid the pre-polymerization reaction of the monomers. In the next alignment process of the liquid crystal layer 34, the pre-tilt angles within the liquid crystal layer 34 are kept to be all the same so as to guarantee the display result of the LCD.

As described above, the present invention has been described with a preferred embodiment thereof and it is understood that many changes and modifications to the described embodiment can be carried out without departing from the scope and the spirit of the invention that is intended to be limited only by the appended claims.

What is claimed is:

1. A mask for curing frame sealant having a transparent substrate, the transparent substrate comprising:
a shading region formed on the transparent substrate and a transparent region adjacent to the shading region as well as a gradient shading region formed in a joining area between the shading region and the transparent region, wherein the gradient shading region is formed integrally and connects to the shading region; when the mask is utilized for exposure, an irradiation transmittance in the gradient shading region is smaller than an irradiation transmittance in the transparent region, but the irradiation transmittance in the gradient shading region is higher than an irradiation transmittance in the shading region; as a distance is increased between the gradient shading region and the shading region, a density of the gradient shading region is gradually decreased, so that the irradiation transmittance in the gradient shading region is linearly changed, wherein the frame sealant is coated on a surface of a first substrate, the gradient shading region of the mask being aligned to and overlapping the frame sealant in a direction perpendicular to the surface of the first substrate.

2. The mask for curing frame sealant according to claim 1, wherein the shading region is formed by a first shading material, the gradient shading region is also formed by the first shading material, and the density of the first shading material in the gradient shading region is smaller than the density of the first shading material in the shading region.

3. The mask for curing frame sealant according to claim 1, wherein the shading region is formed by a first shading material, the gradient shading region is formed by a second shading material, and the irradiation transmittance of the second shading material is higher than the irradiation transmittance of the first shading material.

4. The mask for curing frame sealant according to claim 3, wherein the first shading material is chromium (Cr) and the second shading material is a compound of silicon (Si) and molybdenum (Mo), or a compound of chromium (Cr).

5. A mask for curing frame sealant, the mask comprising a transparent substrate and a shading region forming on the transparent substrate, a transparent region adjacent to the shading region, and a gradient shading region is formed in a joining area between the shading region and the transparent region, wherein the gradient shading region is formed integrally and connects to the shading region; when the mask is utilized for exposure, the irradiation transmittance in the gradient shading region is smaller than the irradiation transmittance in the transparent region, but the irradiation transmittance in the gradient shading region is higher than the irradiation transmittance in the shading region, wherein the frame sealant is coated on a surface of a first substrate, the gradient shading region of the mask being aligned to and overlapping the frame sealant in a direction perpendicular to the surface of the first substrate.

6. The mask for curing frame sealant according to claim 5, wherein the shading region is formed by a first shading material, the gradient shading region is also formed by the first shading material, and the density of the first shading material in the gradient shading region is smaller than the density of the first shading material in the shading region.

7. The mask for curing frame sealant according to claim 5, wherein the shading region is formed by a first shading material, the gradient shading region is formed by a second shading material, and the irradiation transmittance of the second shading material is higher than the irradiation transmittance of the first shading material.

8. The mask for curing frame sealant according to claim 5, when a distance is increased between the gradient shading region and the shading region, the density of the gradient shading region is gradually decreased and the irradiation transmittance in the gradient shading region is linearly changed.

9. The mask for curing frame sealant according to claim 7, wherein the first shading material is chromium (Cr), and the second shading material is a compound of silicon (Si) and molybdenum (Mo), or a compound of chromium (Cr).

10. A liquid crystal display (LCD) panel manufacturing method, the method comprising the following steps:

providing a first substrate, a second substrate, and a mask; wherein a surface of the first substrate is coated by a frame sealant which surrounds display regions; the mask includes a shading region, a transparent region adjacent to the shading region, and a gradient shading region formed in a joining area between the shading region and the transparent region; the gradient shading region is formed integrally and connects to the shading region of the mask;

joining the first substrate and the second substrate together and disposing the mask on the first substrate, and the gradient shading region being aligned to and overlapping the frame sealant in a direction perpendicular to the surface of the first substrate; and exposing the first substrate and the second substrate after the joining step for curing the frame sealant so as to bond the first substrate and the second substrate together; wherein the irradiation transmittance in the gradient shading region is smaller than the irradiation transmittance in the transparent region, but the irradiation transmittance in the gradient shading region is higher than the irradiation transmittance in the shading region.

11. The LCD panel manufacturing method according to claim 10, wherein the first substrate and the second substrate are bonded for the exposing step, the gradient shading region can guide a light to irradiate the frame sealant and not irradiate a plurality of liquid crystal molecules in corresponding display region, and the frame sealant is completely cured by controlling the exposure time.

12. The LCD panel manufacturing method according to claim 10, wherein the shading region is formed by a first shading material, the gradient shading region is also formed by the first shading material, and the density of the first shading material in the gradient shading region is smaller than the density of the first shading material in the shading region.

13. The LCD panel manufacturing method according to claim 10, wherein the shading region is formed by a first shading material, the gradient shading region is formed by a second shading material, and the irradiation transmittance of the second shading material is higher than the irradiation transmittance of the first shading material.

14. The LCD panel manufacturing method according to claim 10, when a distance is increased between the gradient shading region and the shading region, the density of the gradient shading region is gradually decreased and the irradiation transmittance in the gradient shading region is linearly changed.

15. The LCD panel manufacturing method according to claim 13, wherein the first shading material is chromium (Cr), and the second shading material is a compound of silicon (Si) and molybdenum (Mo), or a compound of chromium (Cr).

* * * * *